US012074093B2

(12) United States Patent
Yanagihara et al.

(10) Patent No.: US 12,074,093 B2
(45) Date of Patent: Aug. 27, 2024

(54) INTEGRATED SEMICONDUCTOR DEVICE

(71) Applicant: Panasonic Intellectual Property Management Co., Ltd., Osaka (JP)

(72) Inventors: Manabu Yanagihara, Osaka (JP); Takahiro Sato, Toyama (JP); Hiroto Yamagiwa, Hyogo (JP); Masahiro Hikita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 423 days.

(21) Appl. No.: 17/630,766

(22) PCT Filed: Aug. 21, 2020

(86) PCT No.: PCT/JP2020/031632
§ 371 (c)(1),
(2) Date: Jan. 27, 2022

(87) PCT Pub. No.: WO2021/039629
PCT Pub. Date: Mar. 4, 2021

(65) Prior Publication Data
US 2022/0320091 A1   Oct. 6, 2022

(30) Foreign Application Priority Data
Aug. 30, 2019  (JP) ................... 2019-157650

(51) Int. Cl.
*H01L 21/02*   (2006.01)
*H01L 23/48*   (2006.01)
(Continued)

(52) U.S. Cl.
CPC ........ *H01L 23/481* (2013.01); *H01L 23/4824* (2013.01); *H01L 27/085* (2013.01);
(Continued)

(58) Field of Classification Search
CPC . H01L 23/481; H01L 23/4824; H01L 27/085; H01L 29/7786; H01L 27/0605;
(Continued)

(56) References Cited

U.S. PATENT DOCUMENTS

2005/0189562 A1\*  9/2005  Kinzer .............. H01L 29/41758
                                                  257/E27.012
2009/0078965 A1\*  3/2009  Briere ................ H01L 29/2003
                                                  257/192
2016/0043643 A1   2/2016  Ujita et al.

FOREIGN PATENT DOCUMENTS

JP       2007-522677 A       8/2007
WO       2005/079293 A1      9/2005
WO       WO-2014188651 A1 *  11/2014    ......... H01L 23/4824

OTHER PUBLICATIONS

International Search Report and Written Opinion issued in International Patent Application No. PCT/JP2020/031632, dated Nov. 2, 2020; with partial English translation.

\* cited by examiner

*Primary Examiner* — Niki H Nguyen
(74) *Attorney, Agent, or Firm* — Rimon P.C.

(57) ABSTRACT

An integrated semiconductor device includes an Si substrate, and a high-side transistor and a low-side transistor which configure a half-bridge. A source electrode of a unit transistor configuring the high-side transistor and a drain electrode of a unit transistor configuring the low-side transistor are integrated as a common electrode.

16 Claims, 9 Drawing Sheets

(51) Int. Cl.
*H01L 23/482* (2006.01)
*H01L 27/085* (2006.01)
*H01L 29/778* (2006.01)
H01L 27/06 (2006.01)
H02M 3/335 (2006.01)

(52) U.S. Cl.
CPC ...... *H01L 29/7786* (2013.01); *H01L 27/0605* (2013.01); *H02M 3/33569* (2013.01)

(58) Field of Classification Search
CPC ............... H01L 29/781; H01L 29/7816; H01L 2924/13091; H01L 2924/14; H01L 2223/6611; H01L 2224/16; H01L 23/4821; H01L 29/78; H01L 29/7393; H01L 29/7813; H01L 29/1095; H01L 2924/1306; H02M 3/33569; H02M 1/088; H02M 7/219; H02M 3/003; H02M 7/5387

See application file for complete search history.

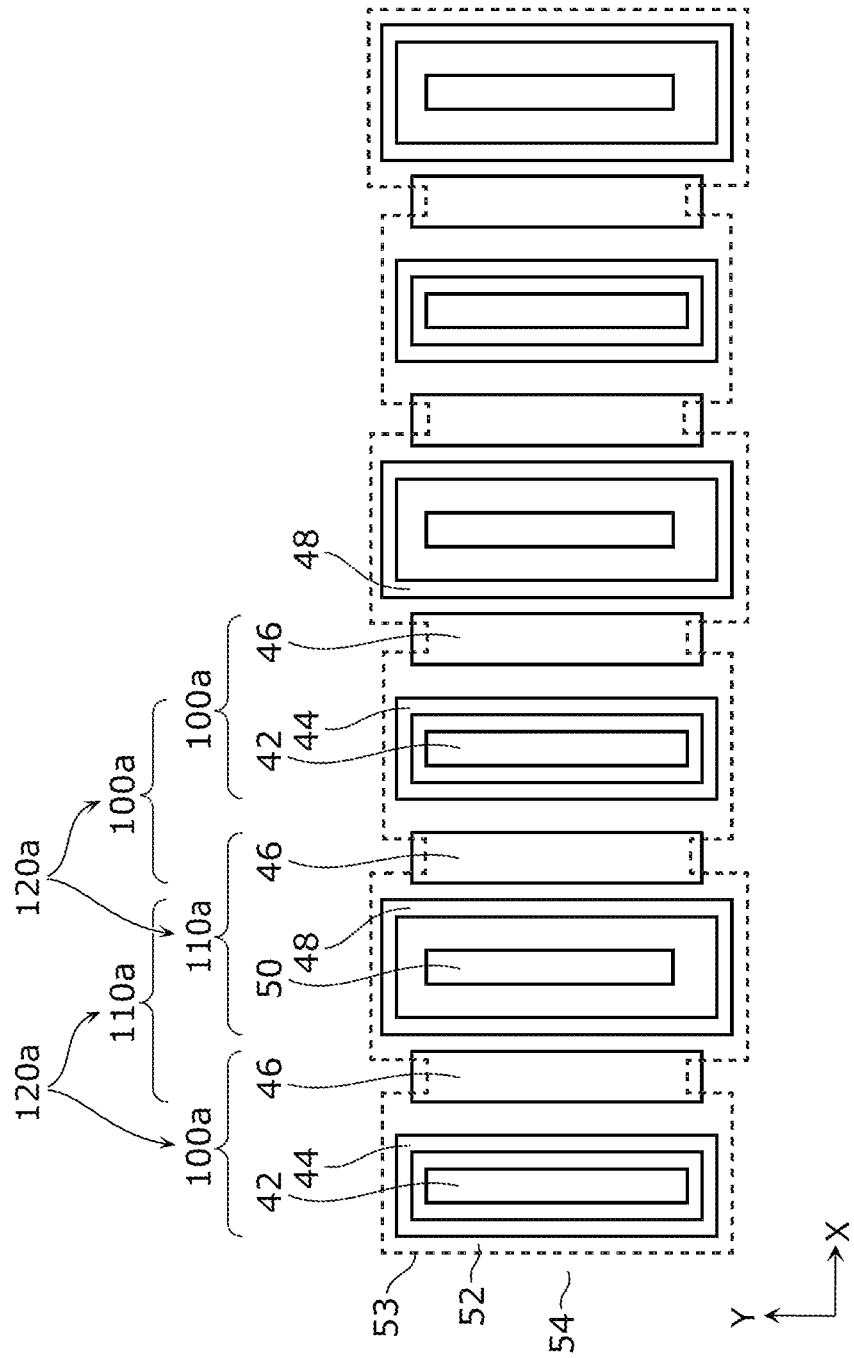

INTEGRATED SEMICONDUCTOR DEVICE

CROSS-REFERENCE OF RELATED APPLICATIONS

This application is the U.S. National Phase under 35 U.S.C. § 371 of International Patent Application No. PCT/JP2020/031632, filed on Aug. 21, 2020, which in turn claims the benefit of Japanese Application No. 2019-157650, filed on Aug. 30, 2019, the entire disclosures of which Applications are incorporated by reference herein.

TECHNICAL FIELD

The present disclosure relates to an integrated semiconductor device in which at least two transistors are integrated.

BACKGROUND ART

As a typical configuration of a switching power supply, there is a half-bridge using one high-side power transistor and one low-side power transistor that are connected. Also, a full-bridge is configured using two such half-bridges, and a 3-phase inverter is configured using three such half-bridges. In a half-bridge, power conversion is performed by turning on and off a high-side power transistor and a low-side power transistor alternately.

As power transistors used for such half-bridge, power transistors having a vertical structure, which has a high withstanding voltage and easily provides a large current, have often been used. A vertical structure is a transistor structure in which a direction of flow of a current is perpendicular to a semiconductor substrate. In this transistor structure, a drain terminal (or a collector terminal) is provided on the back side of a chip (die). Therefore, it is difficult to integrate a half-bridge, which requires insulation between a high-side drain terminal and a low-side drain terminal, on a single chip. Therefore, generally, a half-bridge is formed by modularizing each single transistor chip or assembling each single transistor chip into a package and mounting the package on a board. Where FETs are used for power transistors in such half-bridge, a terminal to which a source of a high-side transistor and a drain of a low-side transistor are connected is an output terminal of the half-bridge.

On the other hand, in recent years, development and productization of GaN power transistors having a horizontal structure in which a channel that allows a current to flow therein is parallel to a semiconductor substrate have progressed. In a horizontal structure, transistors can relatively easily be integrated by the back side of a substrate being used for common ground. For example, Patent Literature (PTL) 1 discloses a half-bridge structure in which a total of two horizontal GaN power transistors are integrated on the high side and the low side of a single chip.

Furthermore, PTL 2 discloses a prior art in which two GaN power transistors on the high side and the low side are integrated by devising respective wirings. In the technique, a half-bridge includes a high-side GaN power transistor formed from a source electrode, a gate electrode, and a drain electrode being repetitively formed in a certain direction (assumed as an X direction), and a low-side GaN power transistor formed from a source electrode, a gate electrode, and a drain electrode being repetitively formed in the same X direction, on one semiconductor substrate in a plan view. An active region of the high-side GaN power transistor and an active region of the low-side GaN power transistor are separated by an element separation region.

The high-side GaN power transistor and the low-side GaN power transistor have the same gate-source distance and the same gate-drain electrode distance. Each low-side drain electrode is provided at a position that is the same in the X direction as but is different in a Y direction (direction perpendicular to the X direction) from the position of the corresponding high-side source electrode. Also, each low-side source electrode is provided at a position that is the same in the X direction as but is different in the Y direction from the position of the corresponding high-side drain electrode. In this layout, a fishbone-like output wiring of the half-bridge, the output wiring connecting a plurality of high-side source electrodes and a plurality of low-side drain electrodes located at positions at which the plurality of low-side drain electrodes face the plurality of source electrodes, is formed.

Where a set of a source electrode, a gate electrode, and a drain electrode is referred to as a unit transistor, a source of a high-side unit transistor and a drain of a low-side unit transistor are connected, and a point of the connection is connected to an output terminal of the half-bridge. A high-side drain terminal is connected to respective drains of the high-side unit transistors, and a low-side source terminal is connected to respective sources of low-side unit transistors.

CITATION LIST

Patent Literature

[PTL 1] Japanese Unexamined Patent Application Publication (Translation of PCT Application) No. 2007-522677
[PTL 2] United States Patent Application Publication No. 2009/0078965

SUMMARY OF INVENTION

Technical Problem

However, a half-bridge in which two conventional GaN power transistors are integrated on a single chip has the problem of insufficiency in chip area reduction.

Therefore, an object of the present disclosure is to provide an integrated semiconductor device formed of a semiconductor chip having an area that is smaller than those of conventional ones.

Solution to Problem

In order to achieve the aforementioned object, an integrated semiconductor device according to an aspect of the present disclosure includes: a semiconductor substrate; and a high-side transistor and a low-side transistor which are integrated on the semiconductor substrate and configure a half-bridge, wherein each of the high-side transistor and the low-side transistor includes an active region, a source electrode, a drain electrode, and a gate electrode, and the source electrode of the high-side transistor and the drain electrode of the low-side transistor are integrated as a common electrode.

In order to achieve the aforementioned object, an integrated semiconductor device according to another aspect of the present disclosure includes: a semiconductor substrate; and a first transistor and a second transistor which are integrated on the semiconductor substrate, wherein each of the first transistor and the second transistor includes an active region, a source electrode, a drain electrode, and a gate electrode, the source electrode of the first transistor and the drain electrode of the second transistor are integrated as a common electrode, and the first transistor and the second transistor are structural components of an active clamp flyback converter.

Advantageous Effects of Invention

According to the present disclosure, an integrated semiconductor device formed of a semiconductor chip having an area that is smaller than those of conventional ones.

BRIEF DESCRIPTION OF DRAWINGS

FIG. 4 is a plan view illustrating an example of an integrated semiconductor device in Embodiment 2.

DESCRIPTION OF EMBODIMENTS

Embodiments will be described in detail below with reference to the drawings. However, in Embodiments 1 to 3 and variations, components that are the same are provided with the same reference sign and overlapping description thereof will be omitted. Also, unless specifically stated otherwise, "on" and "above" indicate the "upward direction" where the back side of an integrated semiconductor device is the "lower (down)" side, that is, the "upward direction" in a sectional view of the integrated semiconductor device, and each includes both the case where the relevant component is in contact with an underlying object and the case where the relevant component is spaced from an underlying object. Unless specifically stated otherwise, "underneath" and "below" indicate the "downward direction" where the front side of the integrated semiconductor device is the "upper (up)" side, that is, the "downward direction" in a sectional view of the integrated semiconductor device, and each includes both the case where the relevant component is in contact with an object located above and where the component is spaced from an object located above.

Embodiment 1

Figure 1A:
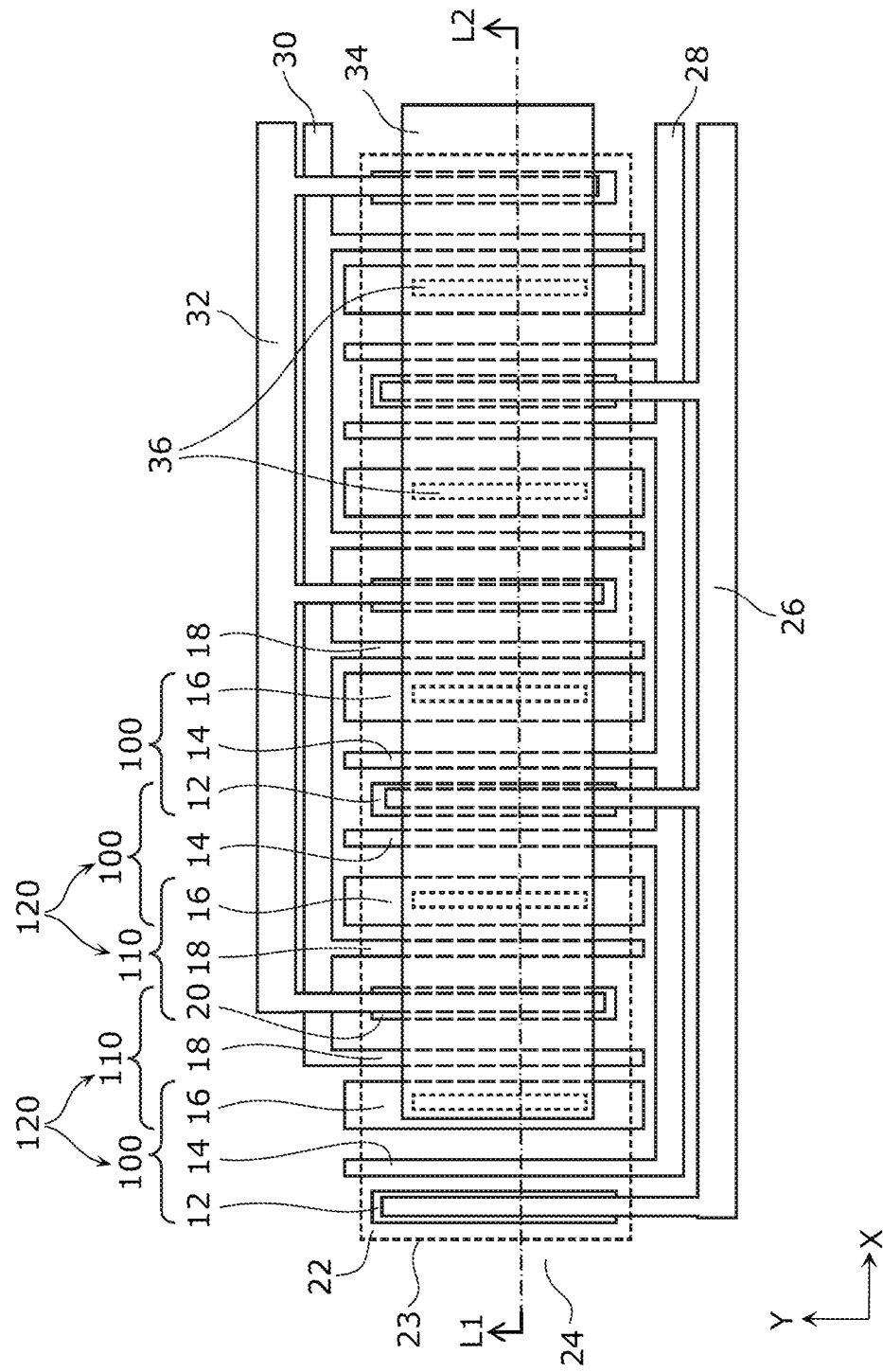
FIG. 1A is a plan view of an integrated semiconductor device in Embodiment 1.

FIG. 1A is a plan view of an integrated semiconductor device configuring a half-bridge in Embodiment 1. Note that, in a plan view, an X direction is a direction in which transistors are aligned and a Y direction is a direction orthogonal to the X direction. Also, FIG. 1B is a sectional view of the integrated semiconductor device cut along line L1-L2 in FIG. 1A.

Figure 1B:
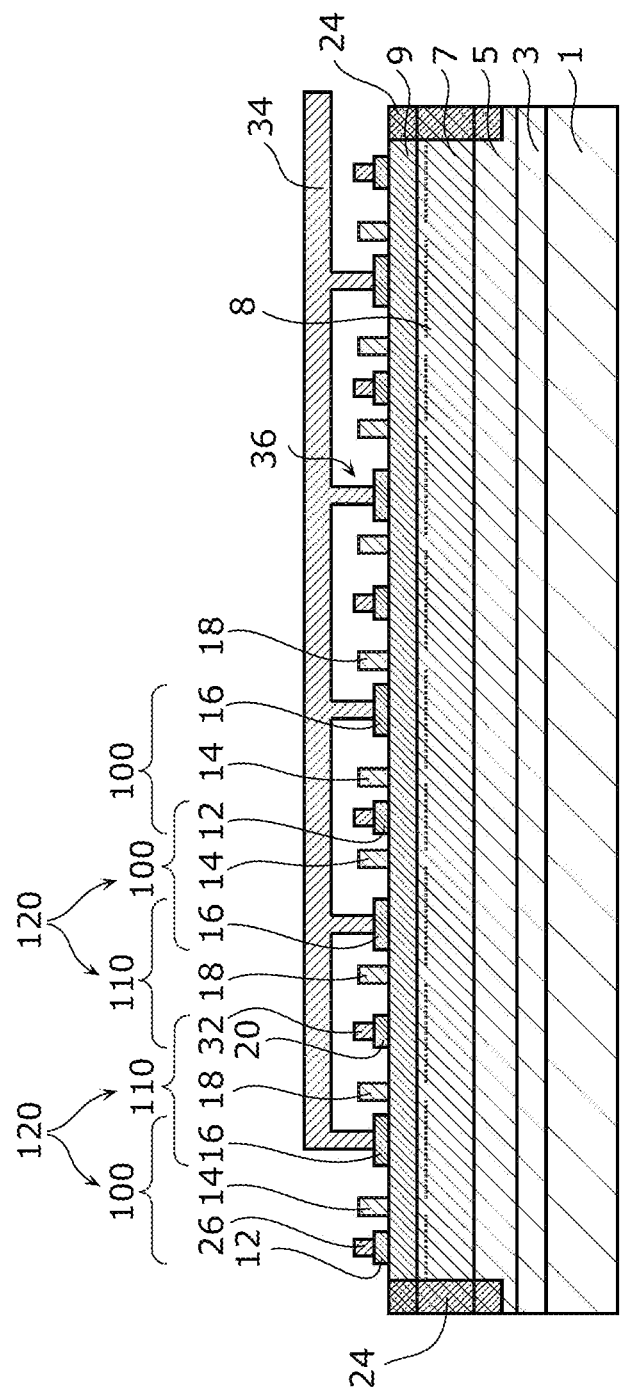
FIG. 1B is a sectional view taken along line L1-L2 in FIG. 1A.

As illustrated in FIG. 1B, as a layer structure, the integrated semiconductor device includes nucleation layer 3 formed from AlN, buffer layer 5, channel layer 7 formed from GaN, and barrier layer 9 formed from AlGaN, on Si (silicon) substrate 1, which is a semiconductor substrate. In an interface between channel layer 7 and barrier layer 9, a high concentration of two-dimensional electron gas 8 is formed by the effects of piezoelectric polarization and spontaneous polarization. Then, for an increase in resistance of two-dimensional electron gas 8, element separation region 24 is formed by ion implantation. As illustrated in FIG. 1A, a region not subjected to the ion implantation, in which two-dimensional electron gas 8 is present, is referred to as active region 22. A boundary between active region 22 and element separation region 24 is element separation boundary 23.

Note that, for reduction of leak current flowing in buffer layer 5, the ion implantation is performed until implanted ions reach buffer layer 5. For implanted ion species, e.g., helium, boron, nitrogen or oxygen, which is relatively small in mass number, is used.

As illustrated in FIG. 1A, low-side source electrodes 12, low-side gate electrodes 14, common electrodes 16, high-side gate electrodes 18, and high-side drain electrodes 20 are each formed in the shape of fingers. Here, both a transistor on a low side (hereinafter also referred to as a low-side transistor) and a transistor on a high side (hereinafter also referred to as a high-side transistor) are of a normally-off type, and thus, two-dimensional electron gas 8 vanishes immediately below each low-side gate electrode 14 and immediately below each high-side gate electrode 18. Each common electrode 16 is a common electrode in which a low-side drain electrode and a high-side source electrode are integrated, and is interposed between low-side gate electrode 14 and high-side gate electrode 18 in a plan view of the integrated semiconductor device. Here, an integrated common electrode means one electrode used in common by two or more transistors, except one formed from two or more electrodes being connected via a wiring. (i) source electrode 12, (ii) gate electrode 14, and (iii) common electrode 16 that doubles as a drain electrode configure low-side unit transistor 100. (i) gate electrode 18, (ii) drain electrode 20, and (iii) common electrode 16 that doubles as a source electrode configure high-side unit transistor 110. Note that a unit transistor is a minimum-unit transistor including a set of a source electrode, a drain electrode and a gate electrode.

One unit half-bridge 120 formed of high-side unit transistor 110 and low-side unit transistor 100 is repeated in the X direction in such a manner that unit half-bridges 120 are disposed in an array, in order to provide a total gate width having a predetermined value. In an example, where a gate width of each high-side unit transistor 110 and a gate width of each low-side unit transistor 100 are both 1 mm, the high-side transistor and the low-side transistor both have a total gate width of 100 mm by 100 unit half-bridges 120 being disposed in an array. Note that as described above, a unit half-bridge is a circuit formed from a high-side unit transistor and a low-side unit transistor. In the present description, an aggregate of a plurality of unit transistors connected in parallel is also simply referred to as "transistor". In particular, an aggregate of high-side unit transistors 110 connected in parallel is also referred to as "high-side transistor", and an aggregate of low-side unit transistors 100 connected in parallel is also referred to as "low-side transistor". Also, an aggregate of a plurality of unit half-bridges 120 connected in parallel is also simply referred to as "half-bridge".

Figure 2:
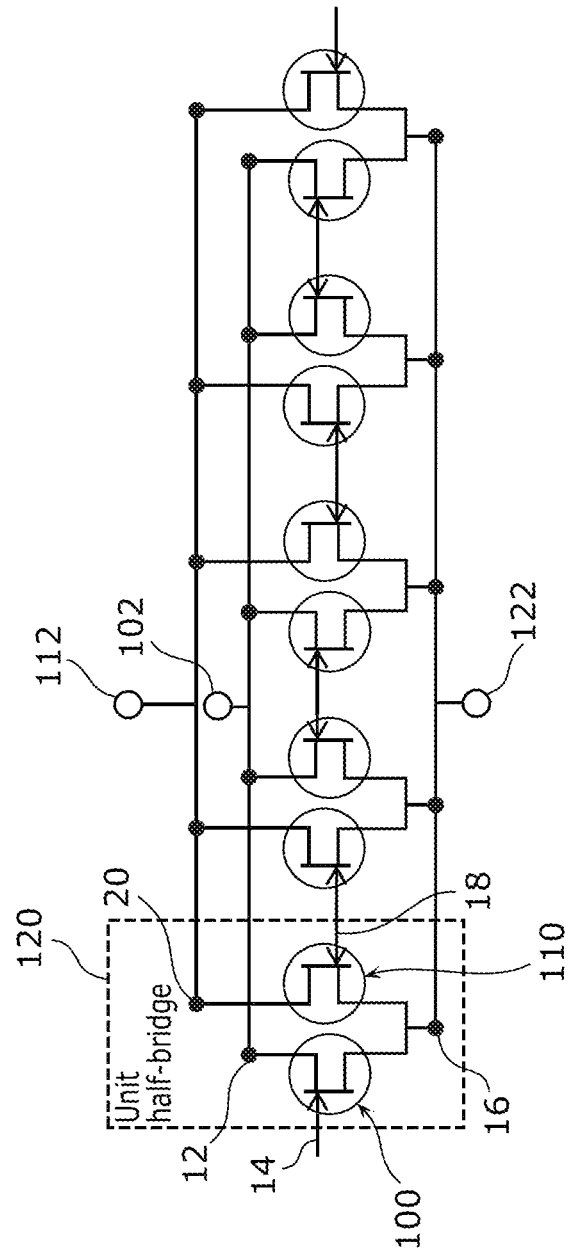
FIG. 2 is an equivalent circuit diagram of the integrated semiconductor device in Embodiment 1.

In FIG. 2, the layout of the integrated semiconductor device in Embodiment 1 is expressed by an equivalent circuit. Unit half-bridge 120 formed from a drain of low-side unit transistor 100 and a source of high-side unit transistor 110 being connected by common electrode 16 is repeated in the X direction in such a manner that unit half-bridges 120 are disposed in an array. Note that in FIG. 2, high-side drain terminal 112 connected to all of the drains on the high side, low-side source terminal 102 connected to all of the sources on the low side, and output terminal 122 of the half-bridge, output terminal 122 being connected to all of common electrodes 16, are also illustrated.

In the present embodiment, since each common electrode 16 serves as both a low-side drain electrode and a high-side source electrode, a chip area is reduced in comparison with conventional techniques in which a low-side drain electrode and a high-side source electrode are provided separately.

Then, low-side source electrodes 12 are led to an external terminal by low-side source line 26 (see FIGS. 1A and 1B), low-side gate electrodes 14 are led to an external terminal by low-side gate line 28 (see FIG. 1A), high-side gate electrodes 18 are led to an external terminal by high-side gate line 30 (see FIG. 1A), and high-side drain electrodes 20 are led to an external terminal by high-side drain line 32 (see FIGS. 1A and 1B). For leading of common electrodes 16, after formation of openings 36 in an insulating film (not illustrated) covering the transistors, pad 34 connected to common electrodes 16 via respective openings 36 is formed (see FIGS. 1A and 1B). Since pad 34 is located above active region 22 (see FIG. 1B), the chip area is reduced in comparison with a case where pad 34 is located above element separation region 24.

Also, in the present embodiment, as illustrated in FIG. 1A, in a plan view of the integrated semiconductor device, each common electrode 16 extends from active region 22 to element separation region 24 across element separation boundary 23, and thus, divides active region 22. This configuration enables curbing of flow-through current from the high-side transistor to the low-side transistor.

Also, in the conventional techniques, high-side and low-side transistors are locally provided in different regions in one chip, and thus, parts in which heat is generated are inhomogeneous in one cycle of switching, causing the reliability problem of a channel temperature of the high-side or low-side transistor easily exceeding an absolute maximum rated temperature. On the other hand, in the present embodiment, unit half-bridges each formed of the high side and the low side are disposed in an array, forming a half-bridge. In other words, the high-side transistors and the low-side transistors are disposed alternately in a plan view of the integrated semiconductor device. Consequently, parts in which heat is generated become homogenous in one cycle of switching, and channel temperatures of the high-side and low-side transistors less easily exceed the absolute maximum rated temperature, and thus, reliability is enhanced.

Note that in the present embodiment, Si substrate 1 is used as the semiconductor substrate. Si substrate 1 is advantageous in enabling cost reduction and diameter increase. Other than that, for the semiconductor substrate, a GaN substrate, an SiC substrate or a sapphire substrate can be used.

As above, the integrated semiconductor device according to the present embodiment includes Si substrate 1, and high-side unit transistors 110 and low-side unit transistors 100 forming a half-bridge (aggregate of unit half-bridges 120), high-side unit transistors 110 and low-side unit transistors 100 being integrated on Si substrate 1, and each high-side unit transistor 110 includes active region 22, a source electrode (common electrode 16), drain electrode 20, and gate electrode 18, and each low-side unit transistor 100 includes active region 22, source electrode 12, a drain electrode (common electrode 16), and gate electrode 14, and the source electrode of high-side unit transistor 110 and the drain electrode of low-side unit transistor 100 are integrated as common electrode 16. Then, each common electrode 16 is interposed between gate electrode 18 of high-side unit transistor 110 and gate electrode 14 of low-side unit transistor 100 in a plan view of the integrated semiconductor device.

Consequently, since each common electrode 16 serves as both a low-side drain electrode and a high-side source electrode, the chip area is reduced in comparison with the conventional techniques in which low-side drain electrodes and high-side source electrodes are provided separately.

Also, high-side unit transistors 110 and low-side unit transistors 100 are disposed alternately in a plan view of the integrated semiconductor device. Consequently, parts in which heat is generated become homogeneous in one cycle of switching via high-side unit transistors 110 and low-side unit transistors 100, and the channel temperatures of the high-side and low-side transistors less easily exceed the absolute maximum rated temperature, and thus, reliability is enhanced.

Also, each common electrode 16 divides active region 22 of high-side unit transistor 110 and low-side unit transistor 100 in a plan view of the integrated semiconductor device. Consequently, flow-through current from high-side unit transistor 110 to low-side unit transistor 100 is curbed.

Also, at least one of drain electrode 20 of each high-side unit transistor 110, source electrode 12 of each low-side unit transistor 100, gate electrode 14 of each low-side unit transistor 100, and each common electrode 16 is provided with pad 34 formed above active region 22 of high-side unit transistors 110 and low-side unit transistors 100. Consequently, since pad 34 is located above active region 22, the chip area of the integrated semiconductor device is reduced in comparison with the case where pad 34 is located above element separation region 24.

Also, each of high-side unit transistors 110 and low-side unit transistors 100 is a GaN transistor. Then, each GaN transistor includes channel layer 7 containing two-dimensional electron gas 8. Consequently, a half-bridge using high electron mobility transistors (HEMTs), which are high-frequency power devices, is provided.

Also, Si substrate 1 is of silicon. Consequently, cost of the integrated semiconductor device can be reduced by using Si substrate 1 that enables cost reduction and diameter increase.

Variations of Embodiment 1

Figure 3:
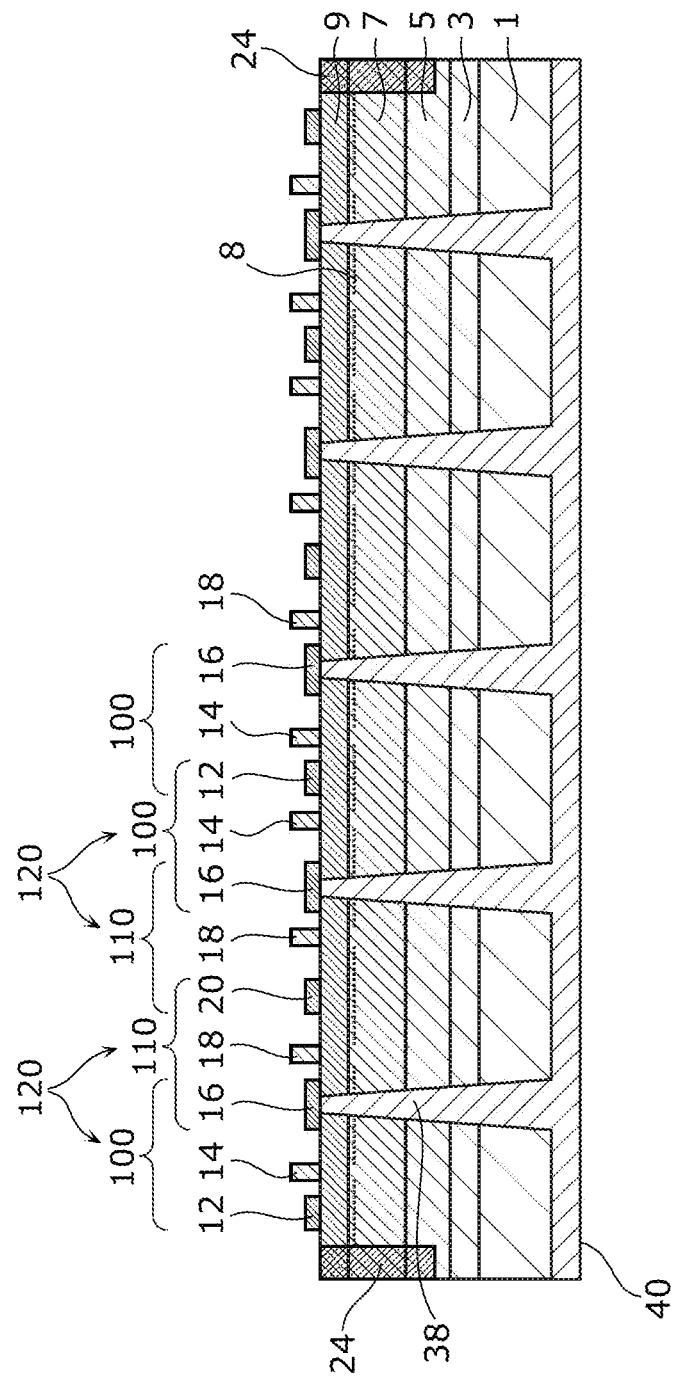
FIG. 3 is a sectional view of an integrated semiconductor device in a variation of Embodiment 1.

FIG. 3 is a sectional view of an integrated semiconductor device according to a variation of Embodiment 1. In Embodiment 1, common electrodes 16 are electrically led to the front side of Si substrate 1 via a wiring technique using an insulating film and is connected to pad 34 for common electrodes 16 formed on the front side. In the present variation, common electrodes 16 are electrically led to the back side of Si substrate 1 by vias 38 extending through Si substrate 1 and semiconductor layers formed thereon.

In other words, in the present variation, the integrated semiconductor device includes backside electrode 40 formed on the back surface of the semiconductor substrate, and vias 38 extending through the semiconductor substrate and each connecting common electrode 16 and backside electrode 40. Consequently, wiring resistance of common electrodes 16 is reduced and parasitic inductance is reduced.

As above, the integrated semiconductor device according to the variation of Embodiment 1 is the integrated semiconductor device according to Embodiment 1, further including backside electrode 40 formed on the back side of Si substrate 1, and vias 38 each extending through Si substrate 1 and connecting any one of drain electrode 20 of high-side unit transistor 110, source electrode 12 of low-side unit transistor 100, and common electrode 16, and backside electrode 40. Consequently, the wiring resistance of common electrodes 16 is reduced and the parasitic inductance is reduced.

Note that although in the present variation, vias 38 each connecting common electrode 16 and backside electrode 40 are provided, instead of or in addition to vias 38, vias each connecting a drain electrode of a high-side transistor and backside electrode 40 or vias each connecting a source electrode of a low-side transistor and backside electrode 40 may be provided. In such case, backside electrode 40 may be connected to the vias in such a manner as to be divided in a plurality of regions insulated from each other.

Embodiment 2

FIG. 4 is a plan view illustrating an example of an integrated semiconductor device configuring a half-bridge in Embodiment 2. Low-side source electrodes 42, low-side gate electrodes 44, common electrodes 46, high-side gate electrodes 48, and high-side drain electrodes 50 are formed. (i) source electrode 42, (ii) gate electrode 44, and (iii) common electrode 46 that doubles as a drain electrode configure low-side unit transistor 100a. (i) gate electrode 48, (ii) drain electrode 50, and (iii) common electrode 46 that doubles as a source electrode configure high-side unit transistor 110a. One unit half-bridge 120a formed of high-side unit transistor 110a and low-side unit transistor 100a is repeated in an X direction in order to provide a total gate width having a predetermined value. Also, in the present figure, active region 52, element separation region 54, and element separation boundary 53, which is a boundary between active region 52 and element separation region 54, are also illustrated.

While in Embodiment 1, gate electrodes form a shape of fingers in a plan view of the integrated semiconductor device of the present disclosure, in the present embodiment, each low-side gate electrode 44 surrounds low-side source electrode 42 and each high-side gate electrode 48 surrounds high-side drain electrode 50 in active region 52. This configuration in which gate electrodes surround respective source electrodes reduces a leak current between a source and a drain in each of high-side and low-side transistors due to an electric field from a gate electrode in an off-state, in comparison with the structure in which gate electrodes extend to element separation region 24 across active region 22 in Embodiment 1.

Also, in the present embodiment, also, as illustrated in FIG. 4, each common electrode 46 divides active region 52 and extends to element separation region 54 across element separation boundary 53. This configuration curbs flow-through current from the high side to the low side.

Also, for a method for forming a lead wiring in the present embodiment, a method that is similar to those for pad 34 in Embodiment 1 and for vias 38 and backside electrode 40 in the variation of Embodiment 1 can be used.

As above, in the integrated semiconductor device according to the present embodiment, gate electrode 48 of each high-side unit transistor 110a surrounds drain electrode 50 of relevant high-side unit transistor 110a and gate electrode 44 of each low-side unit transistor 100a surrounds source electrode 42 of relevant low-side unit transistor 100a in a plan view of the integrated semiconductor device. Consequently, a leak current between a source and a drain in each of high-side and low-side transistors due to an electric field from a gate electrode in an off-state is reduced, in comparison with the structure in which gate electrodes extend to element separation region 24 across active region 22 in Embodiment 1.

Embodiment 3

Figure 5A:
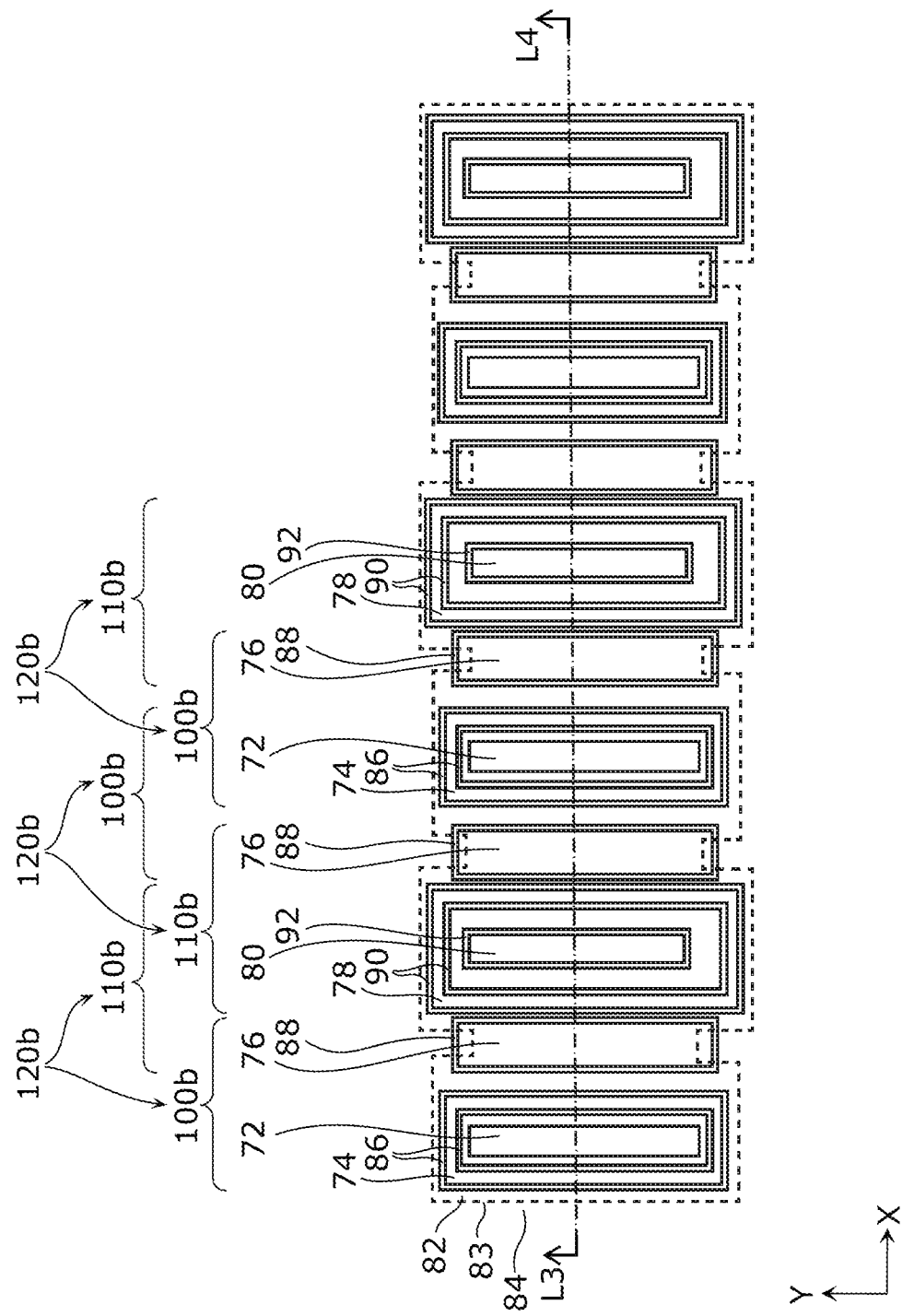
FIG. 5A is a plan view of an integrated semiconductor device in Embodiment 3.
Figure 5B:
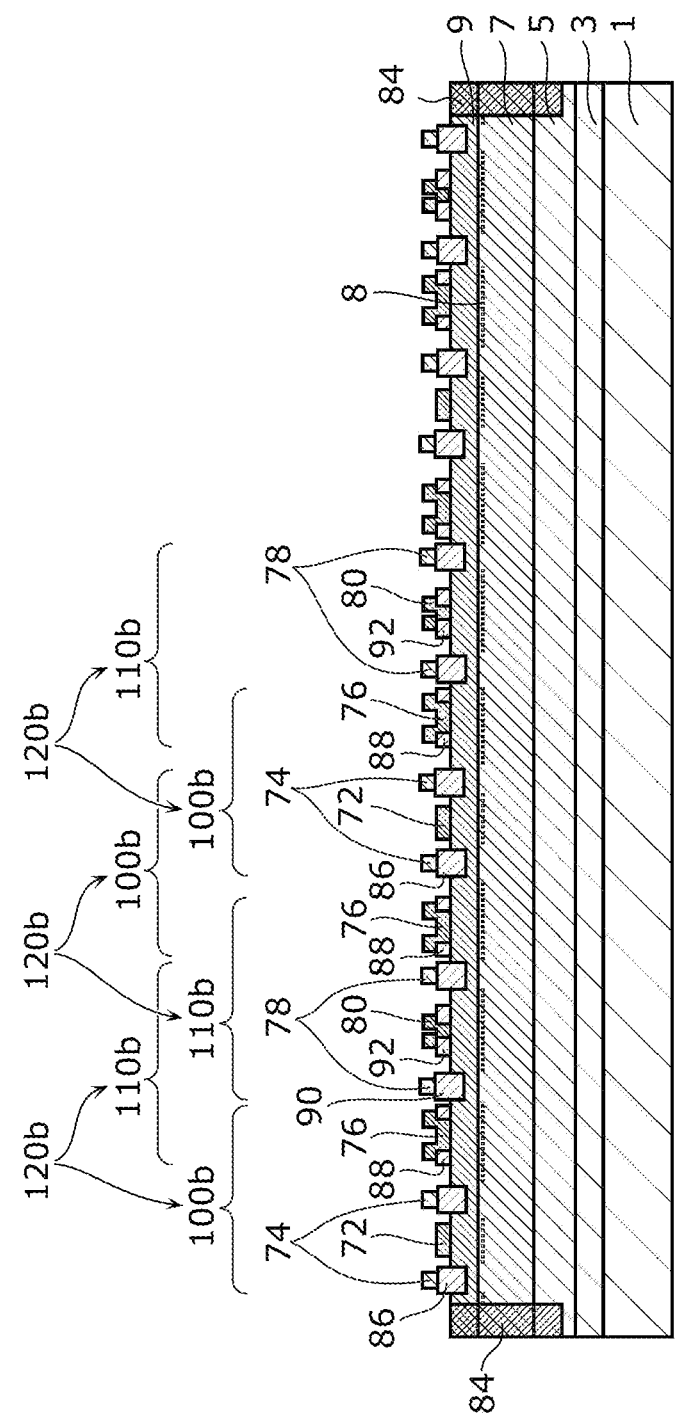
FIG. 5B is a sectional view taken along line L3-L4 in FIG. 5A.

FIG. 5A is a plan view of an integrated semiconductor device configuring a half-bridge in Embodiment 3, and FIG. 5B is a sectional view of the integrated semiconductor device cut along line L3-L4 in FIG. 5A. Low-side source electrodes 72, low-side gate electrodes 74, common electrodes 76, high-side gate electrodes 78, and high-side drain electrodes 80 are formed. (i) source electrode 72, (ii) gate electrode 74, and (iii) common electrode 76 that doubles as a drain electrode configure low-side unit transistor 100b. (i) gate electrode 78, (ii) drain electrode 80, and (iii) common electrode 76 that doubles as a source electrode configure high-side unit transistor 110b. One unit half-bridge 120b formed of high-side unit transistor 110b and low-side unit transistor 100b is repeated in an X direction in order to provide a total gate width having a predetermined value. Also, in the present figure, active region 82, element separation region 84, and element separation boundary 83, which is a boundary between active region 82 and element separation region 84, are also illustrated.

As illustrated in FIG. 5A, in this layout, each low-side gate electrode 74 and corresponding low-side p-type gate region 86 surround low-side source electrode 72 in active region 82. Note that, as illustrated in FIG. 5B, each low-side p-type gate region 86 is connected to corresponding low-side gate electrode 74 and is a semiconductor region provided below corresponding gate electrode 74. Also, as illustrated in FIG. 5A, each high-side gate electrode 78 and corresponding high-side p-type gate region 90 surround drain electrode 80. Note that, as illustrated in FIG. 5B, each high-side p-type gate region 90 is connected to corresponding high-side gate electrode 78 and is a semiconductor region provided below corresponding gate electrode 78. This configuration in which each gate electrode surrounds a source electrode or a drain electrode allows reduction of a leak current between the source and the drain in each of high-side and low-side transistors due to an electric field from a gate electrode in an off-state, in comparison with the structure in which gate electrodes 14 extend to element separation region 24 across active region 22 in Embodiment 1.

Also, in the present embodiment, common electrodes 76 extend from active region 82 to element separation region 84 across element separation boundary 83. This configuration curbs flow-through current from the high side to the low side.

Also, for a method for forming a lead wiring in the present embodiment, a method that is similar to those for pad 34 in Embodiment 1 and for vias 38 and backside electrode 40 in the variation of Embodiment 1 can be used.

The present embodiment is different from Embodiment 2 in that p-type gate regions 86 of the low-side transistor and p-type gate regions 90 of the high-side transistor are used. This configuration makes it easy to obtain a normally-off characteristic of GaN power transistors. In particular, forming low-side p-type gate regions 86 and p-type gate regions of 90 of the high-side transistor in regions resulting from barrier layer 9 being recess-etched, ensuring the normally-off characteristic, and a concentration of a two-dimensional electron gas can be increased in regions that are not recess-etched, reducing on-resistance of the transistors.

Furthermore, as illustrated in FIGS. 5A and 5B, in order to curb current collapse, p-type semiconductor region 88 formed from p-GaN is formed in the periphery of each common electrode 76, and p-type semiconductor region 92 formed from p-GaN is formed in the periphery of each high-side drain electrode 80, in a plan view of the integrated semiconductor device. Each common electrode and corresponding p-type semiconductor region 88 are electrically connected, and if a large potential difference occurs between p-type semiconductor regions 88 and two-dimensional electron gas 8 immediately below p-type semiconductor regions 88, holes are injected from p-type semiconductor regions 88 to barrier layer 9 and channel layer 7, and current collapse is thus curbed.

Likewise, high-side drain electrodes 80 and p-type semiconductor regions 92 are electrically connected, and if a large potential difference occurs between p-type semiconductor regions 92 and two-dimensional electron gas 8 immediately below p-type semiconductor regions 92, holes are injected from p-type semiconductor regions 92 to barrier layer 9 and channel layer 7, and current collapse is thus curbed. In other words, the present configuration allows trapping of electrons at a drain electrode end on which an electric field concentrates to be curbed by injection of holes from p-GaN in each of the high-side transistor and the low-side transistor, and thus, provides a half-bridge using GaN power transistors with current collapse curbed.

As above, in the integrated semiconductor device according to the present embodiment, gate regions (p-type gate regions 90), each of which is a semiconductor region connected to gate electrode 78 of relevant high-side unit transistor 110*b* and provided below gate electrode 78, and gate regions (p-type gate regions 86), each of which is a semiconductor region connected to gate electrode 74 of relevant low-side unit transistor 100*b* and provided below gate electrode 74, are each formed of a p-type semiconductor. Consequently, the normally-off characteristic of GaN power transistors can easily be obtained and the on-resistance of the transistors can be reduced.

Furthermore, in a plan view of the integrated semiconductor device, p-type semiconductor region 88 electrically connected to common electrode 76 is provided in the periphery of each common electrode 76, and p-type semiconductor region 92 electrically connected to drain electrode 80 of relevant high-side unit transistor 110*b* is formed in the periphery of drain electrode 80 of each high-side unit transistor 110*b*. Consequently, a half-bridge using GaN power transistors with current collapse curbed is provided.

Figure 6:
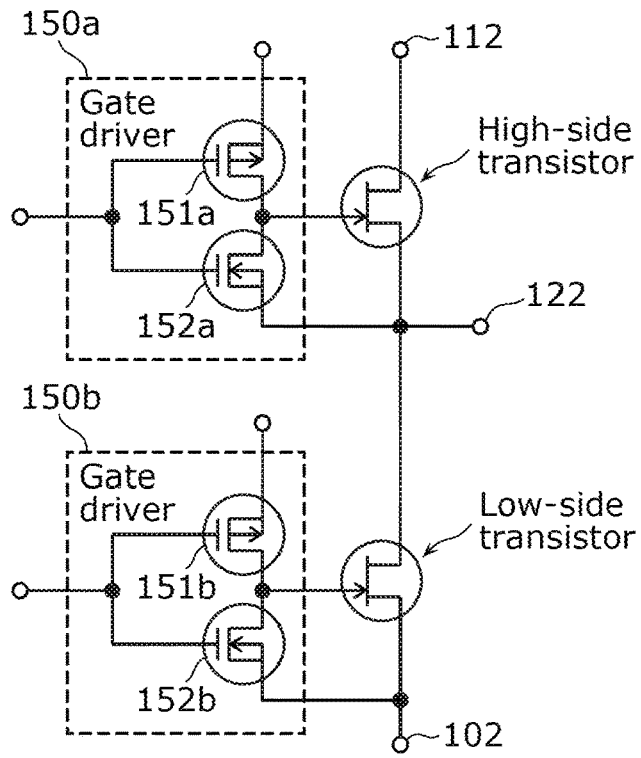
FIG. 6 is a circuit diagram illustrating an example of an integrated semiconductor device including gate drivers, according to the present disclosure.

Note that in each of Embodiments 1 to 3 and the variations, respective gate drivers for driving the high-side transistor and the low-side transistor can also be formed on the single chip to drive the half-bridge. FIG. 6 is a circuit diagram illustrating an example of an integrated semiconductor device including gate drivers 150*a* and 150*b*, according to the present disclosure. Gate driver 150*a* is a circuit that drives a high-side transistor and is formed from p-channel transistor 151*a* and n-channel transistor 152*a* being connected. Gate driver 150*b* is a circuit that drives a low-side transistor and is formed from p-channel transistor 151*b* and n-channel transistor 152*b* being connected. An integrated semiconductor device including such gate drivers 150*a* and 150*b* may be integrated on a single chip. This configuration enables further downsizing of a switching power supply using a half-bridge.

In this way, an integrated semiconductor device may include gate drivers 150*a* and 150*b* that are integrated on Si substrate 1 and drive high-side unit transistors 110 and low-side unit transistors 100, respectively. Consequently, further downsizing of a switching power supply using a half-bridge is enabled.

Note that where GaN is used, n-channel transistors can be fabricated more easily than p-channel transistors, gate drivers may be configured using either or both of n-channel transistors of a normally-on type and a normally-off type.

Figure 7:
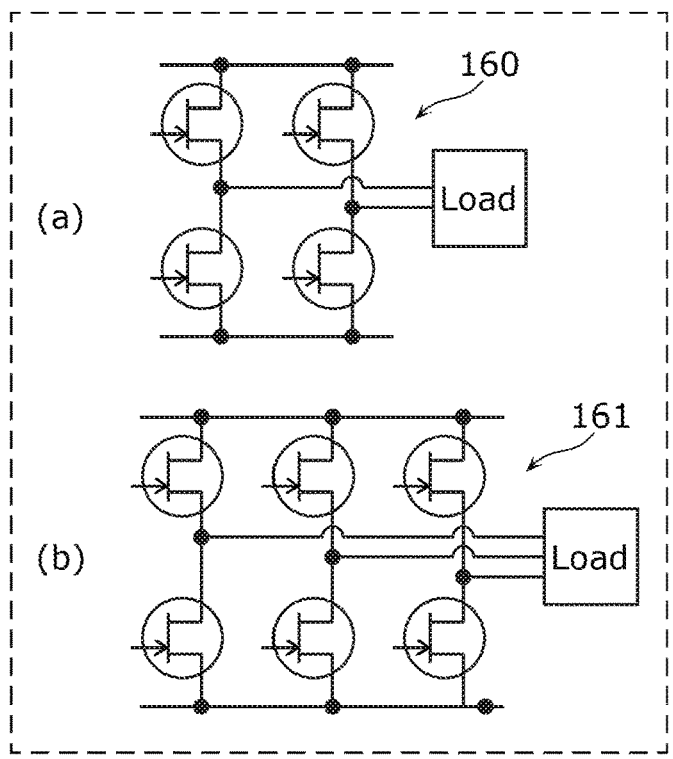
FIG. 7 is a circuit diagram illustrating an example of application of an integrated semiconductor device according to the present disclosure to a full-bridge and a 3-phase inverter.

Also, as in an example of application of an integrated semiconductor device according to the present disclosure to full-bridge 160, which is illustrated in (a) of FIG. 7, a full-bridge is configured using two semiconductor devices each including a half-bridge integrated on a single chip. Also, a full-bridge is formed from two such half-bridges being formed on a single chip.

In this way, an integrated semiconductor device according to the present disclosure may be an integrated semiconductor device formed of a single chip, the integrated semiconductor device including full-bridge 160 configured using two of the integrated semiconductor devices described in Embodiments and variations above. Consequently, a downsized full-bridge can be provided.

Likewise, as in an example of application of an integrated semiconductor device according to the present disclosure to 3-phase inverter 161, which is illustrated in (b) of FIG. 7, a 3-phase inverter is configured using three semiconductor devices each including a half-bridge integrated on a single chip. Also, a 3-phase inverter is formed from three such half-bridges being formed on a single chip.

In this way, an integrated semiconductor device according to the present disclosure may be an integrated semiconductor device formed from one chip, the integrated semiconductor device including 3-phase inverter 161 configured using three of the integrated semiconductor devices described in embodiments and variations above. Consequently, downsized 3-phase inverter 161 is provided.

Figure 8:
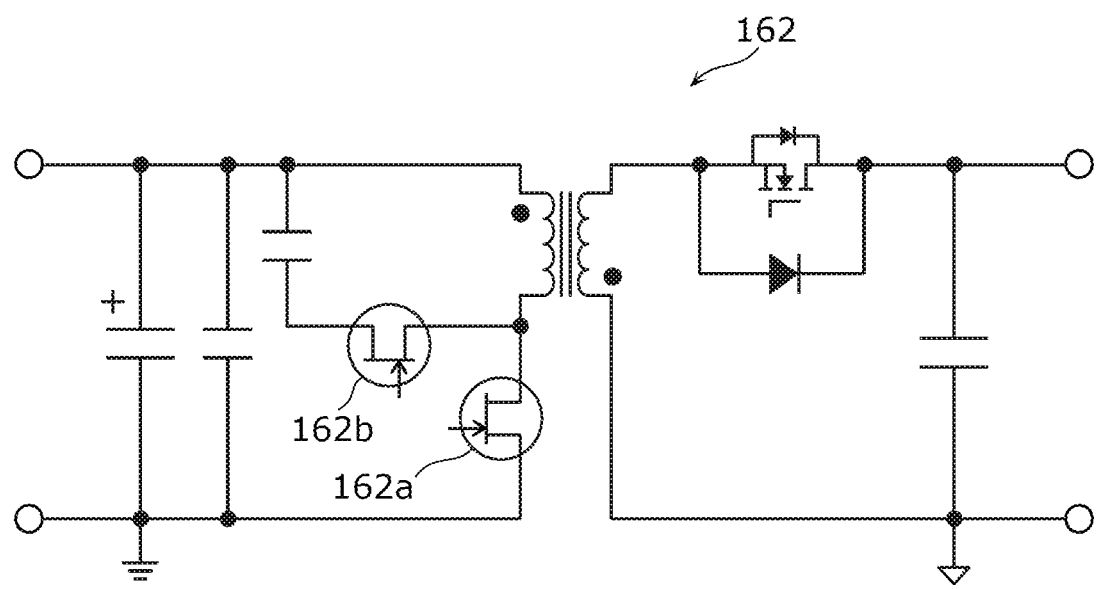
FIG. 8 is a circuit diagram illustrating an example of application of an integrated semiconductor device according to the present disclosure to an active clamp flyback converter

Note that the configuration (two transistors) in the integrated semiconductor device of the present disclosure is not limited to a half-bridge and is applicable to a configuration in which a drain of a first transistor and a source of a second transistor are directly connected. For example, the configuration is applicable to active clamp flyback converter 162 illustrated in FIG. 8. A drain electrode of primary-side transistor 162*a*, which is an example of the first transistor, and a source electrode of clamp circuit-side transistor 162*b*, which is an example of the second transistor, are directly connected, and an integrated semiconductor device of the present disclosure is applicable to a set of primary-side transistor 162*a* and clamp circuit-side transistor 162*b*.

In this way, an integrated semiconductor device according to the present disclosure may include Si substrate 1, and a first transistor (primary-side transistor 162*a*) and a second transistor (clamp circuit-side transistor 162*b*) integrated on Si substrate 1, each of the first transistor and the second transistor includes an active region, a source electrode, a drain electrode, and a gate electrode, the drain electrode of the first transistor and the source electrode of the second transistor are integrated as common electrode 16, the first transistor and the second transistor are structural components of active clamp flyback converter 162. Consequently, downsized flyback converter 162 is provided.

Also, in the above embodiments and the like, a high-side transistor and a low-side transistor are formed from a plurality of unit transistors 110 connected in parallel and a plurality of unit transistors 100 connected in parallel, respectively, but may be formed from single unit transistor 110 and single unit transistor 100, respectively.

Although an integrated semiconductor device according to the present disclosure is described above based on Embodiments 1 to 3, variations thereof, and application examples, the present disclosure is not limited to these embodiments, etc. Forms obtained by making various modifications to the above embodiments, etc., that can be conceived by those skilled in the art, as well as forms realized by combining some structural components in these embodiments, without departing from the essence of the present disclosure, are included in the scope of the present disclosure.

INDUSTRIAL APPLICABILITY

An integrated semiconductor device with two transistors integrated therein according to the present disclosure can be used, for example, as a half-bridge, which is a typical configuration of a switching power supply. The integrated semiconductor device can also be used as a full-bridge configured using two such half-bridges or a 3-phase inverter configured using three such half-bridges. Also, the integrated semiconductor device can also be used as an active clamp flyback converter.

REFERENCE SIGNS LIST

1 Si substrate
3 nucleation layer
5 buffer layer
7 channel layer
8 two-dimensional electron gas
9 barrier layer
12, 42, 72 low-side source electrode
14, 44, 74 low-side gate electrode
16, 46, 76 common electrode
18, 48, 78 high-side gate electrode
20, 50, 80 high-side drain electrode
22, 52, 82 active region
23, 53, 83 element separation boundary
24, 54, 84 element separation region
26 low-side source line
28 low-side gate line
30 high-side gate line
32 high-side drain line
34 pad of common electrode
36 opening of insulating film
38 via
40 backside electrode
86 low-side p-type gate region
88, 92 p-type semiconductor region
90 high-side p-type gate region
100, 100a, 100b low-side unit transistor
102 low-side source terminal
110, 110a, 110b high-side unit transistor
112 high-side drain terminal
120, 120a, 120b unit half-bridge
122 output terminal of half-bridge
150a, 150b gate driver
151a, 151b p-channel transistor
152a, 152b n-channel transistor
160 full-bridge
161 3-phase inverter
162 flyback converter
162a primary-side transistor
162b clamp circuit-side transistor

The invention claimed is:

1. An integrated semiconductor device comprising:
   a semiconductor substrate; and
   a high-side transistor and a low-side transistor which are integrated on the semiconductor substrate and configure a half-bridge, wherein
   each of the high-side transistor and the low-side transistor includes an active region, a source electrode, a drain electrode, and a gate electrode,
   the source electrode of the high-side transistor and the drain electrode of the low-side transistor are integrated as a common electrode, and
   in a plan view of the integrated semiconductor device, the common electrode divides the active region of the high-side transistor and divides the active region of the low-side transistor.

2. The integrated semiconductor device according to claim 1, wherein
   in a plan view of the integrated semiconductor device, the common electrode is interposed between the gate electrode of the high-side transistor and the gate electrode of the low-side transistor.

3. The integrated semiconductor device according to claim 1, wherein
   in a plan view of the integrated semiconductor device, high-side transistors and low-side transistors are disposed alternately, each of high-side transistors being the high-side transistor, each of the low-side transistors being the low-side transistor.

4. The integrated semiconductor device according to claim 1, wherein
   at least one of the drain electrode of the high-side transistor, the source electrode of the low-side transistor, the gate electrode of the low-side transistor, or the common electrode includes a pad disposed above the active region of the high-side transistor and the active region of the low-side transistor.

5. The integrated semiconductor device according to claim 1, further comprising:
   a backside electrode provided on a back surface of the semiconductor substrate; and
   a via which passes through the semiconductor substrate and connects the backside electrode and one of the drain electrode of the high-side transistor, the source electrode of the low-side transistor, and the common electrode.

6. The integrated semiconductor device according to claim 1, wherein
   in a plan view of the integrated semiconductor device:
      the gate electrode of the high-side transistor surrounds the drain electrode of the high-side transistor; and
      the gate electrode of the low-side transistor surrounds the source electrode of the low-side transistor.

7. The integrated semiconductor device according to claim 1, wherein
   (i) a gate region which is connected to the gate electrode of the high-side transistor and is a semiconductor region provided below the gate electrode of the high-side transistor and (ii) a gate region which is connected to the gate electrode of the low-side transistor and is a semiconductor region provided below the gate electrode of the low-side transistor, are each formed of a p-type semiconductor.

8. The integrated semiconductor device according to claim 1, wherein
each of the high-side transistor and the low-side transistor is a GaN transistor.

9. The integrated semiconductor device according to claim 8, wherein
the GaN transistor includes a channel containing a two-dimensional electron gas.

10. The integrated semiconductor device according to claim 8, wherein
the semiconductor substrate comprises silicon.

11. The integrated semiconductor device according to claim 7, wherein
in a plan view of the integrated semiconductor device:
a p-type semiconductor region electrically connected to the common electrode is provided in a periphery of the common electrode; and
a p-type semiconductor region electrically connected to the drain electrode of the high-side transistor is provided in a periphery of the drain electrode of the high-side transistor.

12. The integrated semiconductor device according to claim 1, further comprising:
a gate driver that is integrated on the semiconductor substrate and drives the high-side transistor and the low-side transistor.

13. An integrated semiconductor device formed of a single chip, the integrated semiconductor device comprising:
a full-bridge configured using two of the integrated semiconductor devices according to claim 1.

14. An integrated semiconductor device formed of a single chip, the integrated semiconductor device comprising:
a 3-phase inverter configured using three of the integrated semiconductor devices according to claim 1.

15. An integrated semiconductor device comprising:
a semiconductor substrate; and
a first transistor and a second transistor which are integrated on the semiconductor substrate, wherein
each of the first transistor and the second transistor includes an active region, a source electrode, a drain electrode, and a gate electrode,
the drain electrode of the first transistor and the source electrode of the second transistor are integrated as a common electrode, and
the first transistor and the second transistor are structural components of an active clamp flyback converter.

16. An integrated semiconductor device comprising:
a semiconductor substrate; and
a first transistor and a second transistor which are integrated on the semiconductor substrate, wherein
each of the first transistor and the second transistor includes an active region, a source electrode, a drain electrode, and a gate electrode,
the source electrode of the first transistor and the drain electrode of the second transistor are integrated as a common electrode, and
the first transistor and the second transistor are structural components of an active clamp flyback converter.

* * * * *